US011402512B2

(12) United States Patent
Filarsky et al.

(10) Patent No.: US 11,402,512 B2
(45) Date of Patent: Aug. 2, 2022

(54) GLOBAL NAVIGATION SATELLITE SYSTEM (GNSS) HOSTILE ENVIRONMENT SIMULATION

(71) Applicant: Raytheon Company, Waltham, MA (US)

(72) Inventors: Brian Filarsky, Tucson, AZ (US); Jason Kyle, Tucson, AZ (US); Arnaldo J. Colon, Tucson, AZ (US); William F. Dixon, Tucson, AZ (US); Ender Barillas, Orlando, FL (US)

(73) Assignee: Raytheon Company, Waltham, MA (US)

( * ) Notice: Subject to any disclaimer, the term of this patent is extended or adjusted under 35 U.S.C. 154(b) by 606 days.

(21) Appl. No.: 16/418,498

(22) Filed: May 21, 2019

(65) Prior Publication Data
US 2020/0371250 A1     Nov. 26, 2020

(51) Int. Cl.
| | |
|---|---|
| *G01S 19/23* | (2010.01) |
| *G01S 19/18* | (2010.01) |
| *G01S 19/01* | (2010.01) |
| *G01S 19/21* | (2010.01) |
| *G06F 9/38* | (2018.01) |
| *G01S 19/25* | (2010.01) |
| *G06F 17/14* | (2006.01) |

(Continued)

(52) U.S. Cl.
CPC ............ *G01S 19/23* (2013.01); *G01S 19/015* (2013.01); *G01S 19/18* (2013.01); *G01S 19/215* (2013.01); *G01S 19/256* (2013.01); *G06F 9/3877* (2013.01); *G06F 17/142* (2013.01); *G06F 30/20* (2020.01); *H04K 3/90* (2013.01)

(58) Field of Classification Search
CPC .......... G01S 19/23; G01S 19/15; G01S 19/18; G01S 19/215; G01S 19/256
USPC .................................... 342/17, 25, 125, 147
See application file for complete search history.

(56) References Cited

U.S. PATENT DOCUMENTS

| | | | |
|---|---|---|---|
| 4,454,513 | A | 6/1984 | Russell |
| 5,093,800 | A | 3/1992 | Ifune |
| 5,339,087 | A | 8/1994 | Minarik |

(Continued)

OTHER PUBLICATIONS

Macabiau et al. "Test-Bed for Evaluation of Impact of Evil Waveforms on Real Receivers and SQM Performance," C., ION GPS 2002, Sep. 24-27, 2002, Portland, OR pp. 1-11.

(Continued)

*Primary Examiner* — Bo Fan
(74) *Attorney, Agent, or Firm* — Schwegman Lundberg & Woessner, P.A.

(57) ABSTRACT

A GNSS hostile environment simulator for accurate real-time processor & hardware in the loop (PHIL) simulations of a multiple antenna GNSSR/AJ system models antenna effects over the entire signal bandwidth allowing direct injection of the RF into the GNSSR. Computational efficiency is achieved by applying the antenna patterns in the frequency domain. To preserve the integrity of the antenna signals, the transmitter signals are generated over an extended period to push any residual ringing outside the update window. Efficiency is further enhanced by using a combination of single-precision and double-precision floating-point units to generate the samples of the transmitter signals with single-precision floating-point. All subsequent calculations are then computed in single-precision.

12 Claims, 17 Drawing Sheets

(51) Int. Cl.
*H04K 3/00* (2006.01)
*G06F 30/20* (2020.01)

(56) References Cited

U.S. PATENT DOCUMENTS

| | | | |
|---|---|---|---|
| 5,940,033 | A | 8/1999 | Locher et al. |
| 5,973,638 | A | 10/1999 | Robbins et al. |
| 6,473,034 | B2 | 10/2002 | Lin et al. |
| 7,460,987 | B2 | 12/2008 | Mori et al. |
| 8,040,276 | B2 | 10/2011 | Vadlamani et al. |
| 2018/0188379 | A1* | 7/2018 | Whitworth .............. G01S 19/21 |

OTHER PUBLICATIONS

Howell et al. "AFRL Navigation Warfare (NAVWAR) Testbed," 22nd International Meeting of the Satellite Division of the Institute of Navigation, Savannah, GA, Sep. 22-25, 2009, pp. 147-154.
Brown et al., "Modeling and Simulation of GPS using Software signal generation and digital signal reconstruction," Proceedings of the ION National Technical Meeting, Jan. 2000, Anaheim, CA.
Brown et al., "Advanced GPS Hybrid Simulator Architecture,"Proceedings of ION 57th Annual Meeting, Albuquerque, NM, Jun. 2001.
Gouldsworthy et al. "High-fidelity model development for navigation warfare simulations studies," ION GPS 2002, Sep. 24-27, 2002, Portland, OR pp. 643-654.

* cited by examiner

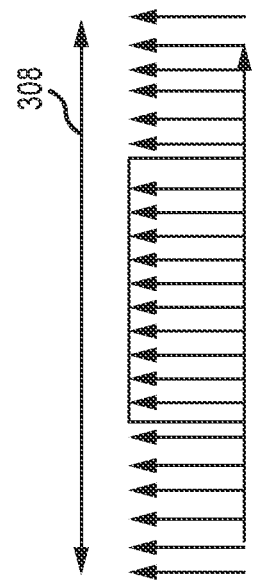
FIG. 7a
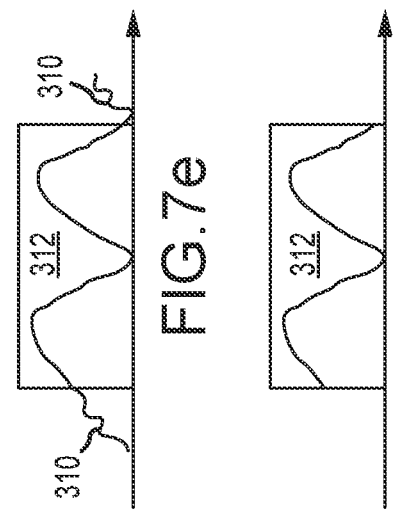
FIG. 7b
FIG. 7c
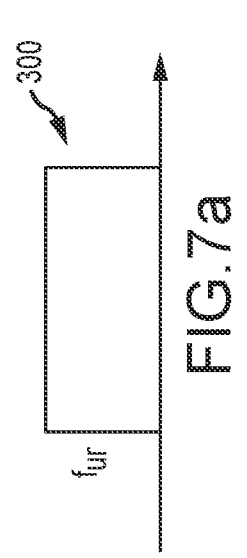
FIG. 7d
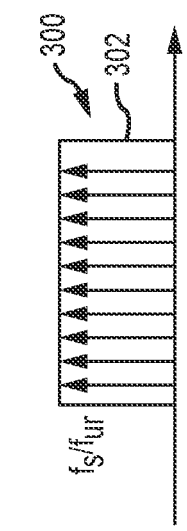
FIG. 7e
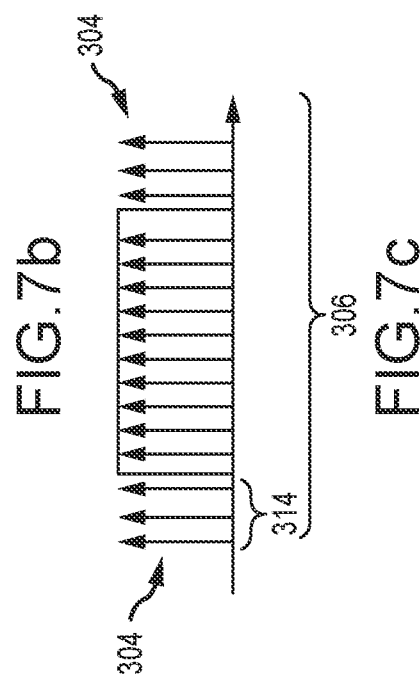
FIG. 7f

GLOBAL NAVIGATION SATELLITE SYSTEM (GNSS) HOSTILE ENVIRONMENT SIMULATION

GOVERNMENT LICENSE RIGHTS

This invention was made with government support under W15QKN-15-D-0019-0002 awarded by the United States Army. The government has certain rights in this invention.

BACKGROUND OF THE INVENTION

Field of the Invention

This invention relates to Global Navigation Satellite System (GNSS) hostile environment simulators.

Description of the Related Art

Global Navigation Satellite System (GNSS) receivers are capable of receiving information from satellites and calculating the geographic position of the receiver. Different countries have their own deployed GNSS. GNSS is used in many military and commercial applications to determine time, position, and velocity to support navigation. The U.S. has its Global Positioning System (GPS), Europe has GALILEO, the Russian's have GLONASS and the Chinese have BEIDOU.

As shown in FIG. 1, a GNSS guided missile 10 is launched from a launch platform 12 to prosecute a target 14. The GNSS receiver on-board missile 10 receives information 16 from GNSS satellites 18 to update its position to maintain a trajectory to target 14. GNSS signals are already quite weak when they arrive at the GNSS receiver.

The GNSS environment may be further challenged by natural or man-made systems. Natural conditions may include extreme dynamic motion of the missile, obstructions to the line-of-sight or extreme environmental conditions. Man-made challenges may exist in the form of jammers 20 (random noise intended to swamp out the GNSS signals), spoofers 22 (generate a fake GNSS signal) or repeaters 24 (repeat a legitimate GNSS signal) all of which are designed to confuse the GNSS receiver. The GNSS receivers can be designed to operate in GNSS challenged environments typically employing multiple antenna elements in a Controlled Reception Pattern Array (CRPA) configuration with Anti-Jam (AJ) hardware (and software) sometimes integrated into the GNSS receiver (R) and AJ hardware (GNSSR/AJ). However, as the man-made threats increase, the GNSSR/AJ receivers and navigation functions must be adapted and rigorously tested to ensure their viability and robustness.

Live testing, particularly of military devices in degraded environments is difficult, time consuming and extremely costly. Consequently, GNSS satellite and threat wave-front simulators are used to characterize and test the embedded software and hardware of GNSSR/AJ receivers in GNSS degraded environments. The preferred type of testing is conducted in real time with the flight hardware unit under test (UUT) in the loop. The simulations should be very accurate and able to mimic the different types of natural and man-made challenges in real time. A critical part of any GNSS environment simulation is the accurate representation of the UUT RF receive antenna patterns to various signals, particularly when simulating natural and man-made threats.

As shown in FIG. 2, in an embodiment a PHIL (Processor and Hardware In-the-Loop) simulator 30 includes a UUT 32, a trajectory simulator 34 and a GNSS hostile environment simulator 36 that produce a simulated GNSS degraded environment 38. The flight hardware includes a plurality of GNSS antennas 40 configured to receive GNSS signals 42 and threat signals 44. UUT includes a GNSS receiver 46 and a guidance system 48 that processes information from the GNSS receiver 46 and generates control signals 50 that drive actuators to manipulate fins 52 that control the trajectory of the UUT. The UUT does not typically have any GNSS antennas, the simulated signals bypass the antennas and are applied directly to the GNSS receiver 46.

In a simulation, the control signals 50 are directed to trajectory simulator 34 to calculate sensor data 54 that is fed back to GNSS receiver 46 and trajectory data 56 that is fed back to the GNSS environment simulator 36. Sensor data 54 may for example include gyroscope readings, accelerometer data etc. as if the UUT was flying. Trajectory data 56 may include the translational and rotational states of the simulated vehicle such as position and attitude. The data may also include higher derivatives e.g., velocity, acceleration and jerk. The specific sensor and trajectory data depends on the UUT.

GNSS environment simulator 36 is provided with the specified GNSS orbits and threats to be simulated and the antenna patterns for the all antennas. The GNSS environment simulator receives the trajectory data 56 and generates in real-time the GNSS signals 42 and threat signals 44 for each GNSS antenna 40 that are fed to the UUT. These signals bypass the UUT antennas and are provided directly to the GNSSR/AJ receiver.

Different techniques have been used to implement the GNSS environment simulator in order to provide accurate signals in real-time to properly exercise the UUT. The earliest systems used RF signal generators to generate the analog jammer signals. The analog signal is split and manipulated using analog controllable attenuators and delay lines to emulate the response of each GNSSR/AJ antenna. The antenna pattern was limited to a value taken at the center of the frequency band. The signals of each transmitter are combined for each simulated receive antenna and the resulting signal is combined with the output from a GNSS signal simulator before the signal is injected into the UUT RF receive channel.

Later systems employed a digital architecture to generate the time domain GNSS and threat signals and apply the antenna patterns to those signals. A digital architecture uses either a central processing unit (CPU) and/or graphics processing unit (GPU) to compute the I, and Q signal samples required to generate the desired signals. The CPU or GPU applies the antenna patterns by multiplying the time domain signals by coefficients representing the amplitude and phase effects of the receive antennas. Again, the antenna pattern was assumed to be constant over frequency to simplify the computation. A software defined radio (SDR) converts the digital time domain GNSS signals from baseband to an RF carrier (e.g., 1.5 GHz).

Another RF environment simulation testbed uses a combination of vector signal generators, filtered noise generators, and a SPIRENT system to generate the analog RF GNSS and threat signals. The testbed converts the analog signals to digital, applies the antenna patterns to these digital time domain signals using a bank of finite impulse response (FIR) filters and reconverts the signals to analog. The FIR filters allow for the application of a frequency-dependent antenna pattern that is more accurate than assuming a constant value. This approach relies on analog hardware to generate the signals, is computationally intensive to apply the antenna patterns and is limited in the quantity and type of signal being generated. See "AFRL Navigation Warfare (NAVWAR) Testbed" Dana Howell et. al. 22$^{nd}$ International Meeting of the Satellite Division of the Institute of Navigation, Savannah, Ga., Sep. 22-25, 2009 pp. 147-154

SUMMARY OF THE INVENTION

The following is a summary of the invention in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description and the defining claims that are presented later.

The present invention provides a GNSS hostile environment simulator for accurate real-time processor & hardware in the loop (PHIL) simulations of a multiple antenna GNSSR/AJ system in a dynamic or static trajectory. Antenna effects are modeled over the entire signal bandwidth allowing direct injection of the RF into the GNSSR.

Computational efficiency allowing for real-time simulation is achieved by applying the antenna patterns in the frequency domain instead of the time-domain. To preserve the integrity of the antenna signals, the transmitter signals are generated over an extended period to push any residual ringing outside the update window in which the signals are generated. Efficiency is further enhanced by using a combination of single-precision and double-precision floating-point units to generate the samples of the transmitter signals with single-precision floating-point. All subsequent calculations are computed in single-precision. The use of double-precision to calculate a reference phase for generating the samples of the transmitter signals establishes an initial higher level of accuracy. The resulting antenna signals are more accurate than they would otherwise be using single-precision throughout. Computations may be performed using CPU cores and a GPU to further improve efficiency.

In an embodiment, the GNSS hostile environment simulator comprises one or more processors configured to receive simulated trajectory data for the UUT and calculate geometry between the UUT and each of a plurality of simulated signal transmitters and configured to (a) based on the geometry, calculate a time-domain digital transmitter signal for each said simulated signal transmitter, (b) perform a frequency transformation on each transmitter signal, (c) apply a frequency-dependent antenna pattern for each of a plurality of RF antennas to each of a plurality of transmitter signal in the frequency domain, (d) for each said RF antenna, accumulate the frequency components for all of the signal transmitters to form frequency-domain digital antenna signals, and (e) perform an inverse frequency transformation on each said antenna signal to generate time-domain digital antenna signals for each said RF antenna at baseband frequencies. A software defined radio (SDR) converts the time-domain digital antenna signals from baseband to RF signals to drive the UUT's RF receiver.

In an embodiment, the processor(s) compute the transmitter signals over an extended period both before and after an update window and then retain only the portion of the antenna signals within the update window to eliminate ringing in the retained antenna signals. Preferably the number of samples in the extended period is a power of two matching the length of the forward and inverse frequency transforms (e.g. FFT and IFFT).

In an embodiment, the one or more processors comprise single-precision and double-precision floating point units configured to calculate the time-domain transmitter signal with single precision. All subsequent computations are performed in single-precision floating point. Further, the transmitter signals may be computed as one or more sinusoidal signals. For each sample number and a reference sample number, the single-precision floating point unit computes a phase based on the reference sample number and a reference phase and then computes the sinusoidal signal based on that phase, increments the sample number and the reference sample number and if the reference sample number does not exceed a threshold computes a next phase. If the threshold is exceeded, the double-precision floating point unit updates the reference phase for the incremented sample number, resets the reference sample number and returns control to the single-precision floating point unit to compute the phase for the next sample number.

These and other features and advantages of the invention will be apparent to those skilled in the art from the following detailed description of preferred embodiments, taken together with the accompanying drawings, in which:

BRIEF DESCRIPTION OF THE DRAWINGS

FIGS. 7a-7f are a sequence of diagrams illustrating the use of signal extension to eliminate ringing in the antenna signal;

DETAILED DESCRIPTION OF THE INVENTION

The present invention provides a GNSS hostile environment simulator for accurate real-time processor & hardware in the loop (PHIL) simulations of a multiple antenna GNSSR/AJ system in a dynamic or static trajectory. Antenna effects are modeled over the entire signal bandwidth allowing direct injection of the RF into the GNSSR. Computational efficiency allowing for real-time simulation is achieved by applying the antenna patterns in the frequency domain instead of the time-domain. To preserve the integrity of the antenna signals, the transmitter signals are generated over an extended period to push any residual ringing outside the update window in which the signals are generated. Efficiency is further enhanced by using a combination of single-precision and double-precision floating-point units to generate the samples of the transmitter signals with single-precision floating-point. All subsequent calculations are then computed in single-precision. The use of double-precision to calculate a reference phase for generating the samples of the transmitter signals establishes an initial higher level of accuracy. The resulting antenna signals are more accurate than they would otherwise be using single-precision throughout.

Without loss of generality, an embodiment of a GNSS hostile environment simulator will be presented where L is the number of simulated transmitter signals TX, M is the number of RF antennas (receivers) and simulated antenna signals RX, O is the number of delivered samples per update window and N is the number of samples calculated and the length of the FFT. L is an integer of one or more. M is an integer of one or more e.g. 4. O is an integer determined by the update rate fur of the trajectory data and a sampling rate fs of the transmitter signals. N is typically a power of two ($2^P$ where P is an integer) such as N=2048 or 4096 (P=11 or 12).

Figure 1:
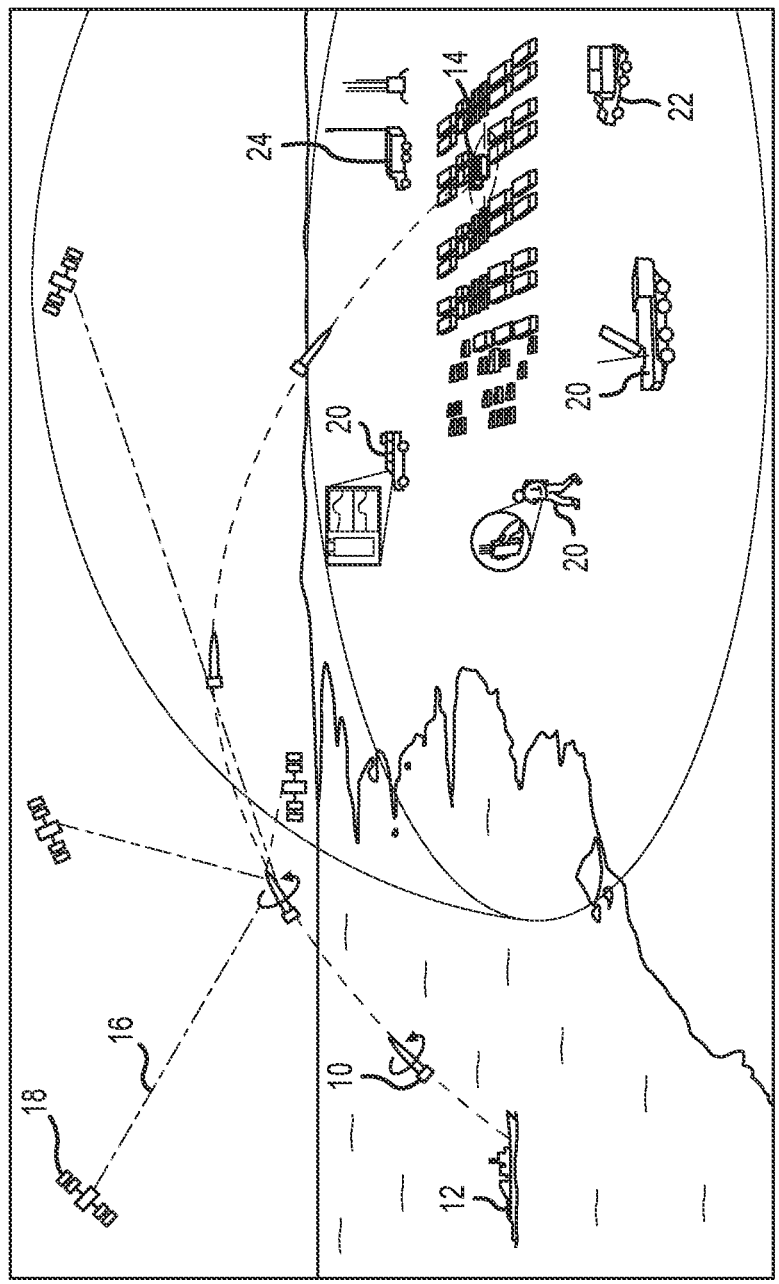
FIG. 1, as described above, illustrates a simulated environment for GNSS navigation.
Figure 2:
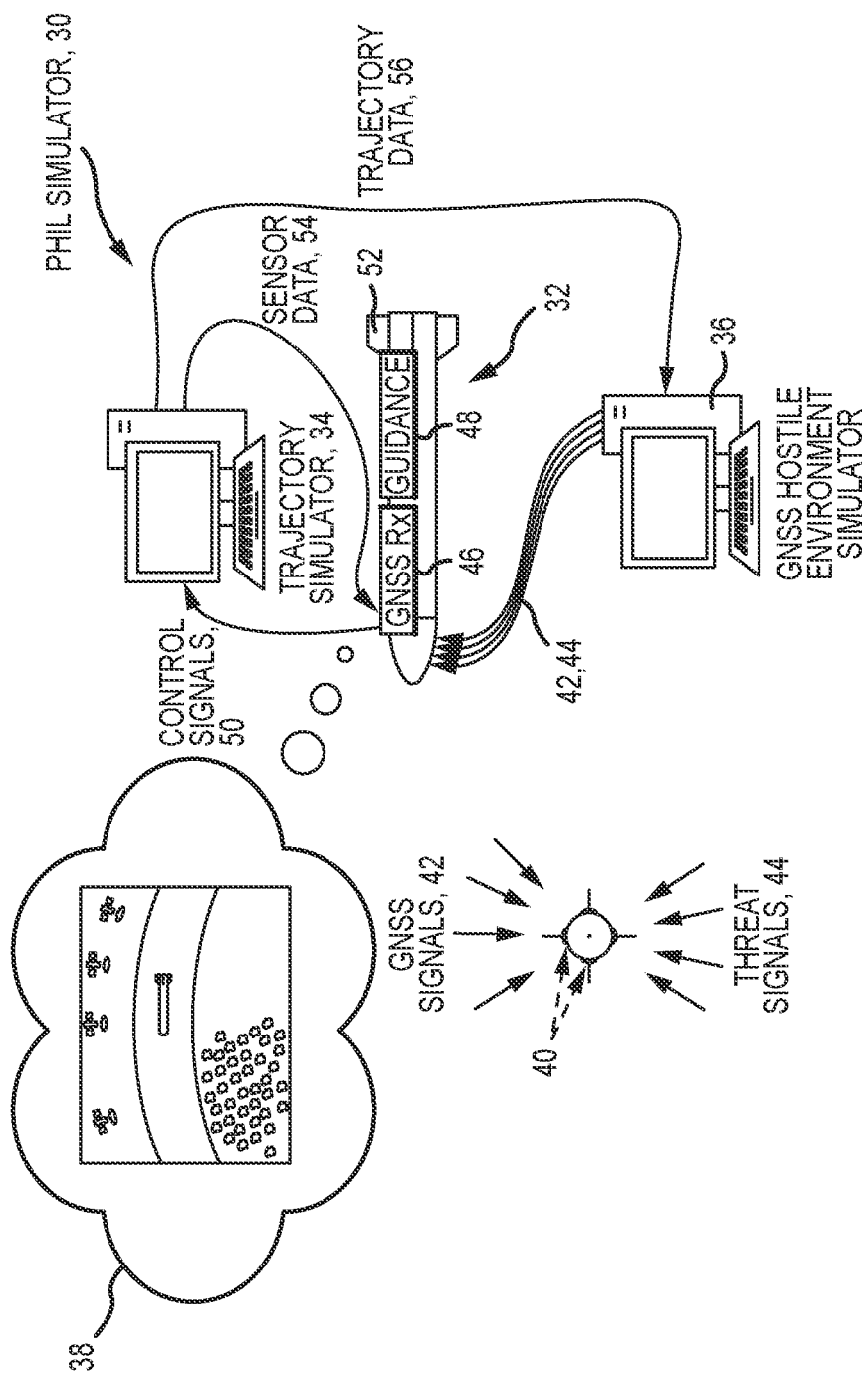
FIG. 2, as described above, illustrates a PHIL simulator including a GNSS hostile environment simulator for a unit under test (UUT)
Figure 3:
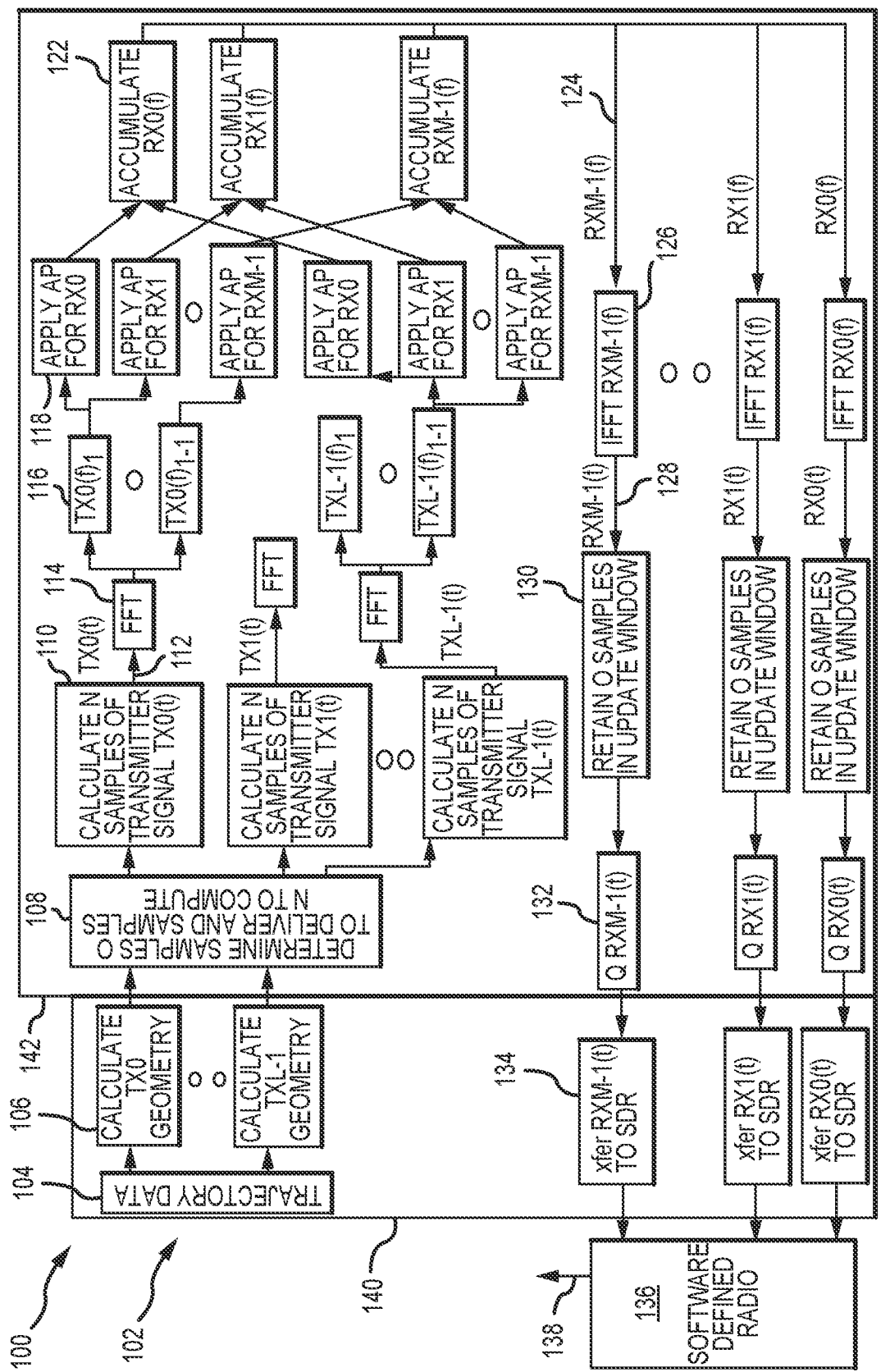
FIG. 3 is a block diagram of an embodiment of a GNSS hostile environment simulator that applies a frequency-independent antenna pattern in the frequency domain to the transmitter signals.

Referring now to FIG. 3, in an embodiment a GNNS hostile environment simulator 100 includes one or more processors 102 configured to receive simulated trajectory data 104 for a UUT at an update rate fur. The trajectory data may be read from a file or over a network and are propagated from an arbitrary rate to a constant high rate (e.g., 16.5 kHz). The processor(s) calculate geometry 106 between the UUT and each of a plurality of simulated signal transmitters TX0, TX1, . . . TXL−1 where L is the number of transmitters at the update rate.

Based on the update rate fur, which defines an "update window", and the sampling rate fs, the processor(s) calculate the number of delivered samples O=fs/fur and number of calculated samples N (step 108). For FFT efficiency, the length N of the FFT is an integer power of two. Accordingly the simulator is configured to compute N>O samples. This is a common occurrence in signal analysis. Typically, the actual number of signal samples O is "zero padded" up to the length N of the FFT. As will be discussed in detail below, zero padding will induce "ringing" that distorts the antenna signals delivered to the GNSSR receiver. Any degradation of the antenna signals is to be avoided. To preserve the integrity of the antenna signals, the transmitter signals are generated over an extended period before and after the update window to push any residual ringing outside the update window in which the signals are generated and then retain only those O samples within the update window. This is possible because in a simulation we control the generation of the transmit signals.

Based on the geometry, the processor(s) calculate 110 a time-domain digital transmitter signal $TX0(t)_n$, $TX1(t)_n$, . . . $TXL-1(t)_n$ 112 for each said simulated signal transmitter where sample number n=0 to N−1. The transmitter signal from each simulated signal transmitter is calculated as seen at a fixed reference point relative to the UUT. The processor(s) perform a frequency transformation (e.g. an FFT of length N) 114 on each transmitter signal 112 and output transform coefficients $TX0(f)_l$, $TX1(f)_l$, . . . $TXN-1(f)_l$ 116 equal in number to the number of samples N of the time-domain transmitter signals where the transmitter index l=0 to L−1. The processor(s) apply a frequency-dependent antenna pattern 118 for each of a plurality (M) of RF antennas to each of the plurality of transmitter signals in the frequency domain to output complex valued (e.g., gain and phase) transform coefficients.

For each RF antenna, the processor(s) accumulate 122 the frequency components for all L of the signal transmitters to form frequency-domain digital antenna signals RX0(f), RX1(f), . . . RXM−1(f) 124, and perform an inverse frequency transformation 126 (e.g. IFFT) on each antenna signal to generate time-domain digital antenna signals RX0(t), RX1(t), . . . RXM−1(t) 128 for each RF antenna at baseband frequencies. The processor(s) retain only the O samples in the update window 130, quantize 132 each of the antenna signals RX0(t), RX1(t), . . . RXM−1(t) and transfer the data 134 via an external connection (e.g., a 10 to 40 G Ethernet connection) to a Software Defined Radio (SDR) 136 that converts the time-domain digital antenna signals RX0(t), RX1(t), . . . RXM−1(t) from baseband to RF antenna signals 138 (e.g., GNSS or threat) to drive the UUT's RF receiver.

The UUT's GNSSR processes signals in a band typically spanning 20 MHz. The one or more GNSS hostile environment simulator processors 102 are configured to generate transmitter signals and apply the frequency-dependent antenna patterns over the entire band allowing direct injection of the RF into the GNSSR. The processor(s) suitably include a central processing unit (CPU) 140 and a graphics processing unit (GPU) 142. A CPU typically has a few dozen processing cores. By contrast a GPU typically has thousands of processing courses and uses Single Instruction Multiple Data (SIMD). In this embodiment, the CPU 140 supports six threads running specific tasks (e.g., one to receive trajectory and five to calculate geometry for the L transmitters) and one thread to coordinate calculations and data movement. The GPU 142 supports thousands of threads to perform the N×M×L calculations to apply the antenna patterns to the transmit signals for each receiver in parallel.

Figure 4A:
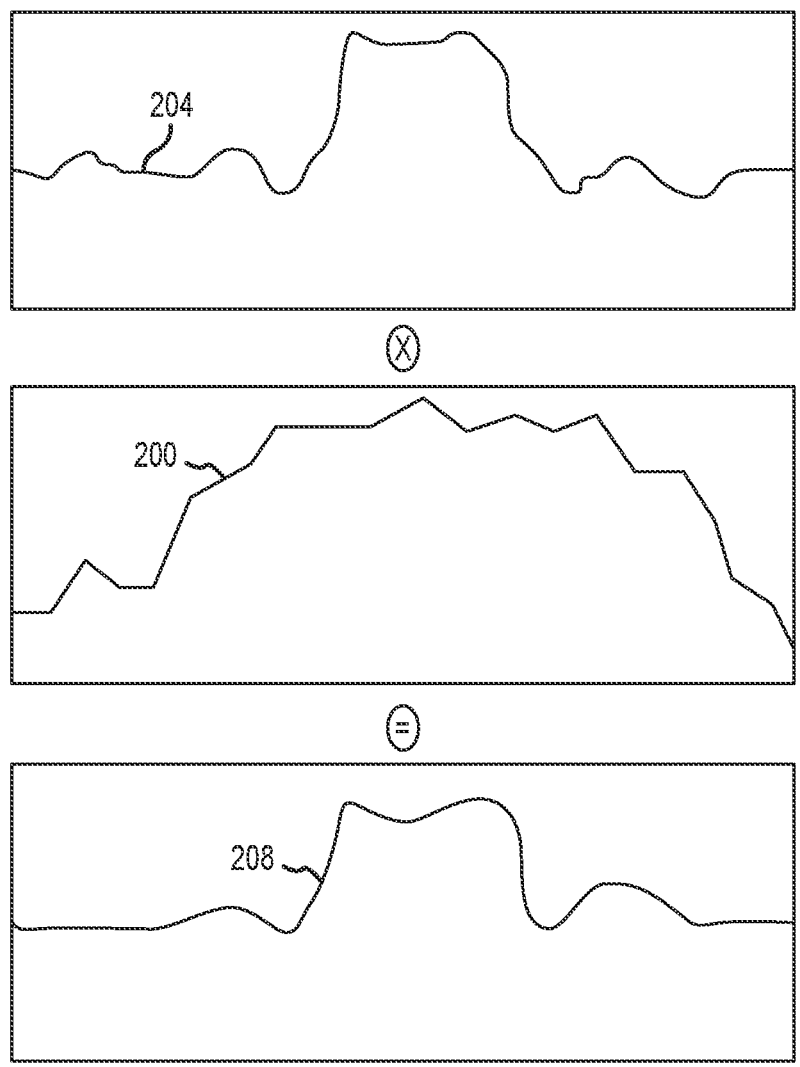
FIGS. 4a and 4b are plots illustrating the application of the complex amplitude and phase components of the antenna pattern to the transmitter signals in the frequency domain.
Figure 4B:
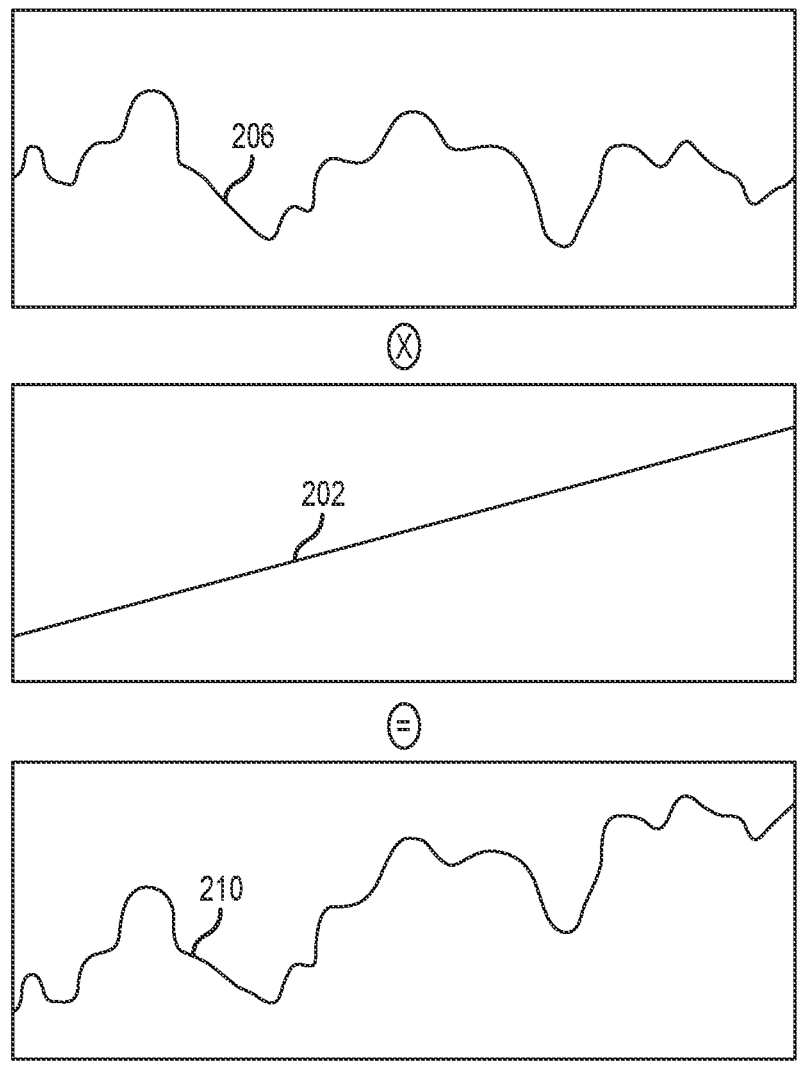

Referring now to FIGS. 4a and 4b, an antenna pattern gain 200 and phase 202 may be specified as a 3D spherical lookup table (LUT) indexed by frequency, Azimuth (Az) and Elevation (El). The processor(s) look up the complex valued gain/phase for a given RF antenna based on the Az/El of a given transmitter signal based on its geometry with respect to the reference point on the simulated vehicle. Typically, the number of bands specified for an antenna pattern is much less than the number of transform coefficients N (e.g. 50 bands and 4096 coefficients). Consequently, the gain/phase for the bands are interpolated up to N gain/phase values. This may be done using a $0^{th}$ order interpolation (stair step), $1^{st}$ order interpolation (linear) or $2^{nd}$ order interpolation (curve). In this example, linear interpolation was applied to the antenna pattern coefficients. The one or more processors apply the frequency-dependent antenna pattern by multiplying each transmitter signal (amplitude 204 and phase 206) at each frequency by a complex value representing the antenna pattern (gain 200 and phase 202) at the corresponding frequency for each RF antenna to output a modified frequency spectrum (amplitude 208 and phase 210) for each transmitter signal as seen by each antenna. Assuming, N FFT coefficients, M antennas and L transmitter signals, the processor(s) apply N*M*L antenna patterns for each update window. The contributions of each transmitter signal are accumulated for each RF antenna.

Referring now to FIGS. 5a-5b and 6a-6b, the number of computations required to apply the antenna patterns to the multitude of GNSS and threat signals is considerable. To provide a real-time simulation without sacrificing accuracy is a challenge. In computing, floating-point is the formulaic representation that approximates a real number so as to support a trade-off between range and precision. A number is, in general, represented approximately to a fixed number of significant digits (the significand) and scaled using an exponent; the base for scaling is normally two, ten or sixteen. A floating point unit (FPU) is a math coprocessor as part of a computer system specially designed to carry out operations on floating point numbers such as addition, subtraction, multiplication, division, square root and bitshifting. Under current convention, single-precision floating-point occupies 4 bytes (32) bits in computer memory and double-precision floating-point occupies 8 bytes (64) bits in computer memory.

Figure 5A:
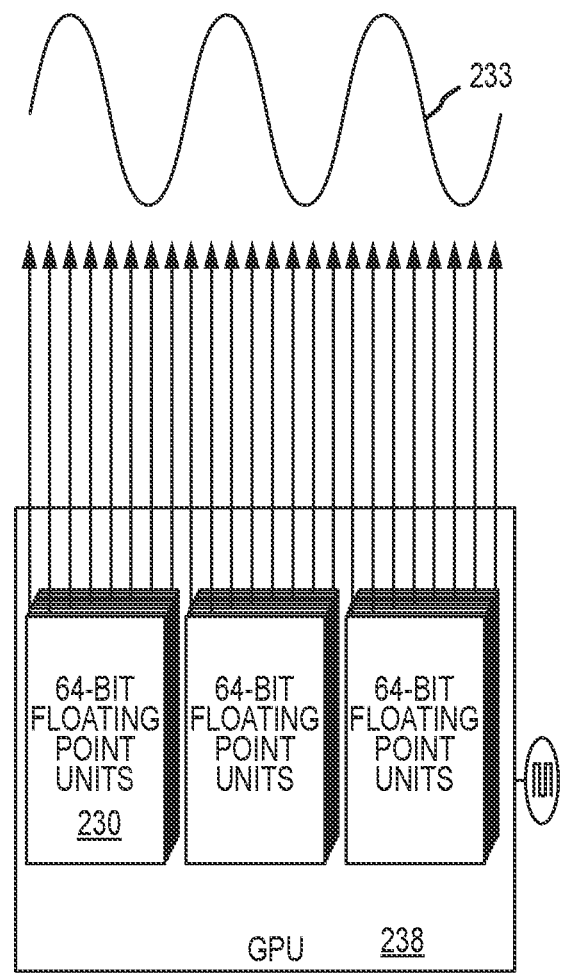
FIGS. 5a and 5b illustrate the use of double-precision floating point units to generate the transmitter signals.
Figure 5B:
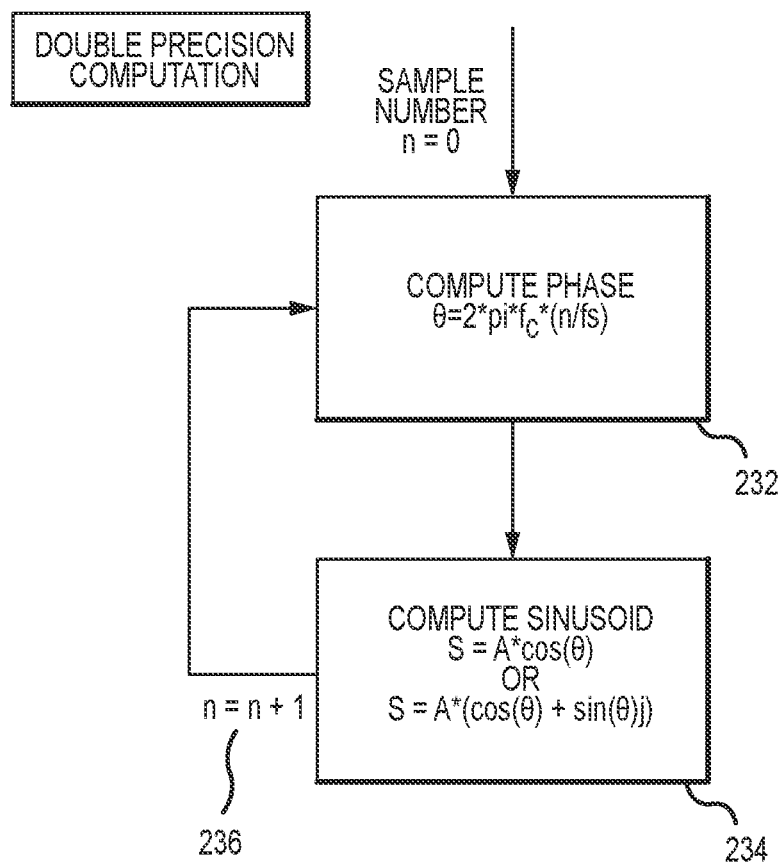

As shown in FIGS. 5a-5b, all of the calculations may be performed with double-precision (e.g., 64-bit) floating point units 230. To generate given sinusoidal transmit signal, the double-precision floating point unit 230 computes a phase $$\theta = 2*\pi*f_c\left(\frac{n}{fs}\right)$$

(step 232) for an initial sample number n=0 where $f_c$ is the signal frequency and $f_s$ is the sampling frequency, computes a sinusoid 233 S=A*cos($\theta$) or S=A*(cos($\theta$)+sin($\theta$)) (step 234), increments the sample number n=n+1 (step 236) and repeats for the specified number of samples N. All subsequent calculations are performed with double-precision. This approach maintains the accuracy of double-precision but at the computation burden of double-precision. In this example, the double-precision floating point units are part of a GPU 238.

Figure 6A:
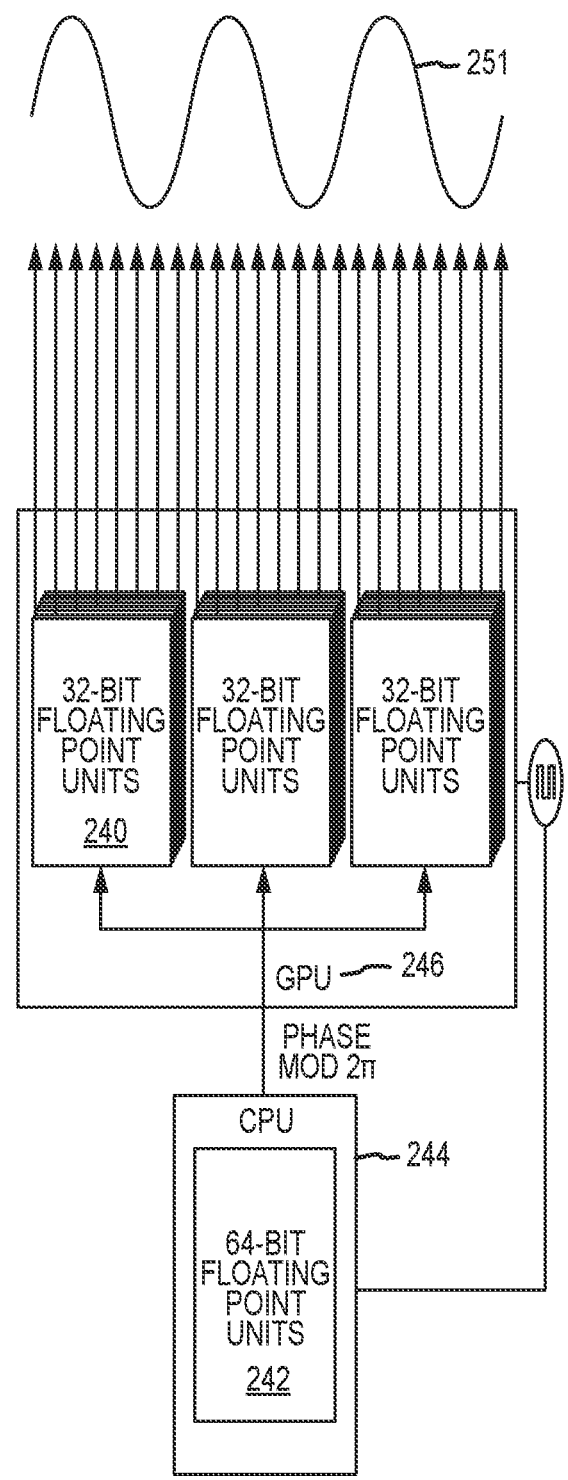
FIGS. 6a and 6b illustrate the use of a mix of single-precision and double-precision floating point units to generate single-precision transmitter signals.
Figure 6B:
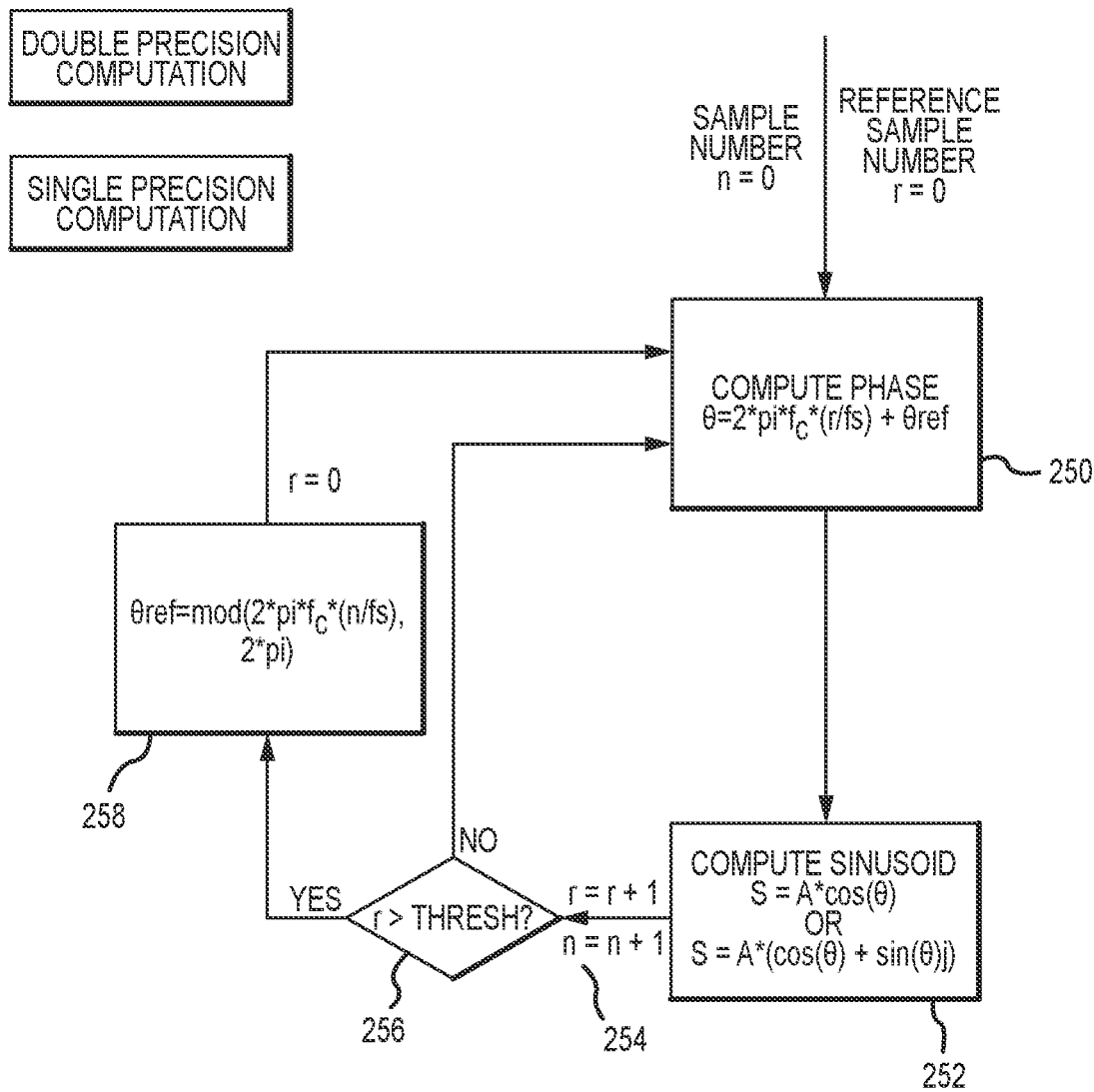
Figure 8A:
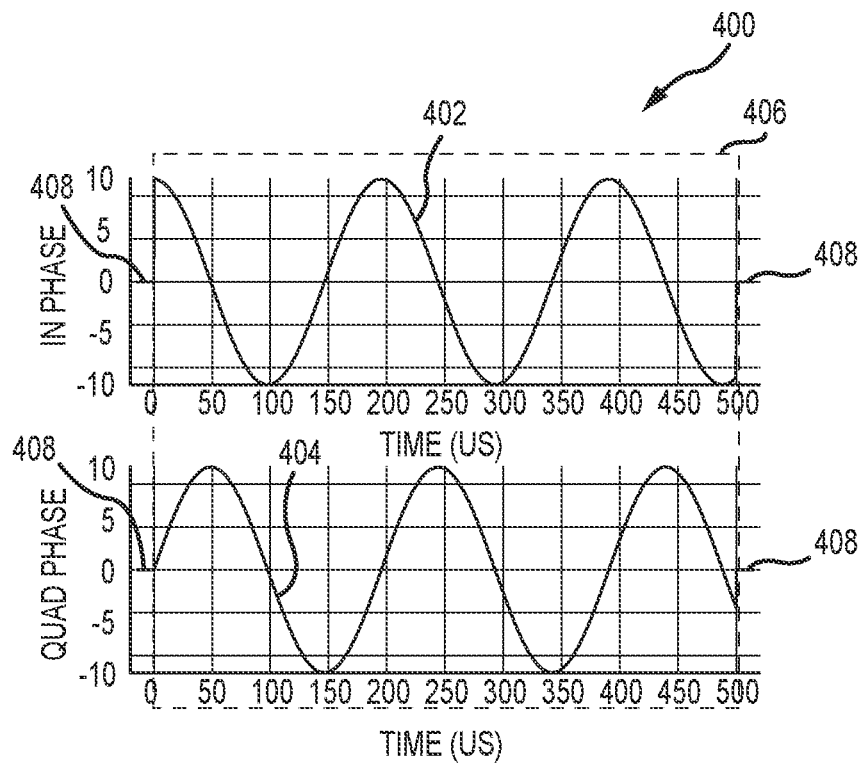
FIGS. 8a-8g illustrate the effects of ringing on the antenna signals with conventional zero padding.
Figure 9A:
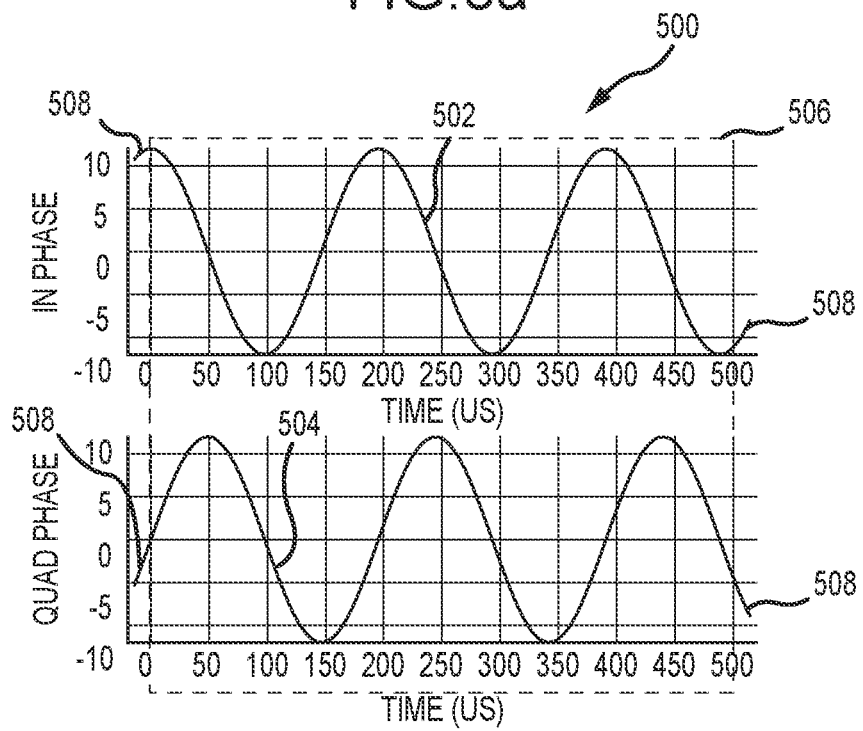
FIGS. 9a-9g illustrate the elimination of ringing in the antenna signals with using signal extension.
Figure 8B:
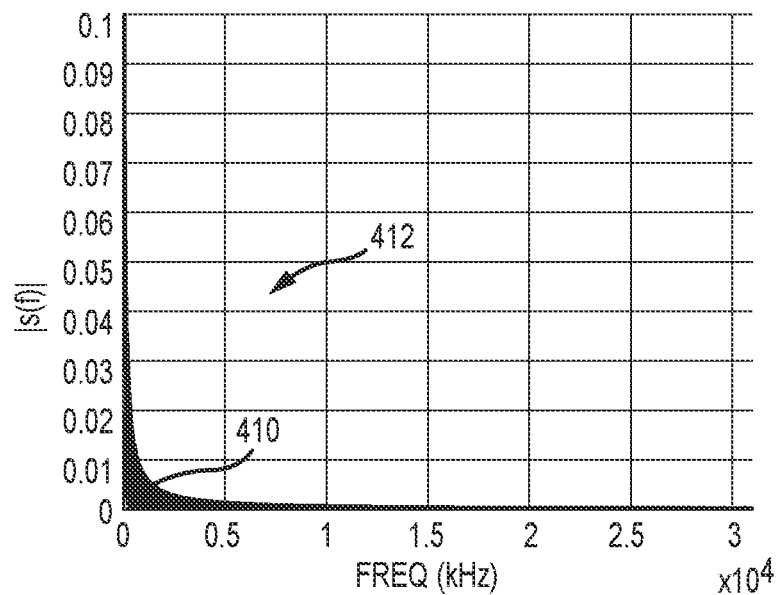
Figure 9B:
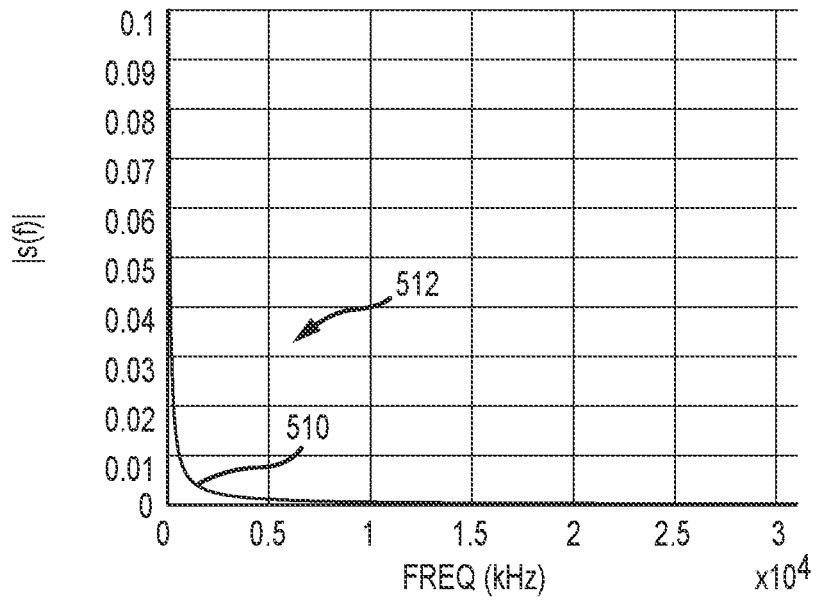
Figure 8C:
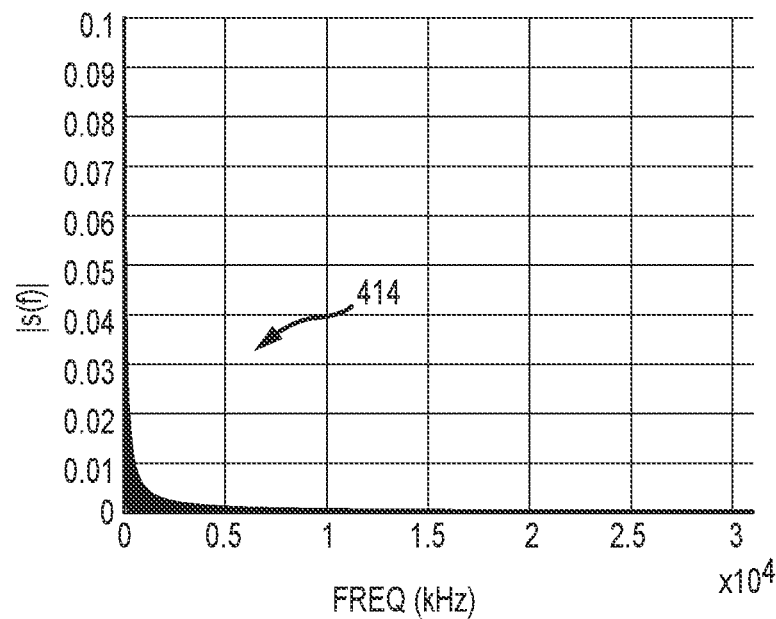
Figure 9C:
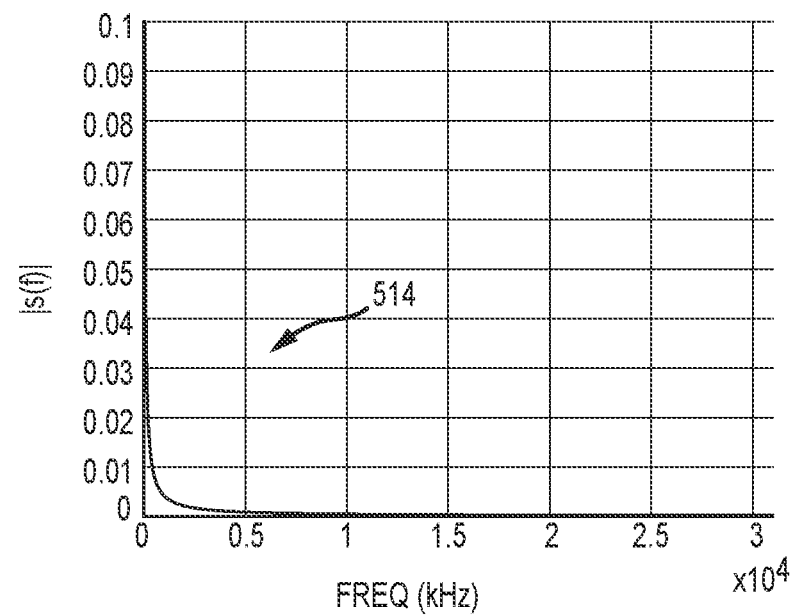
Figure 8D:
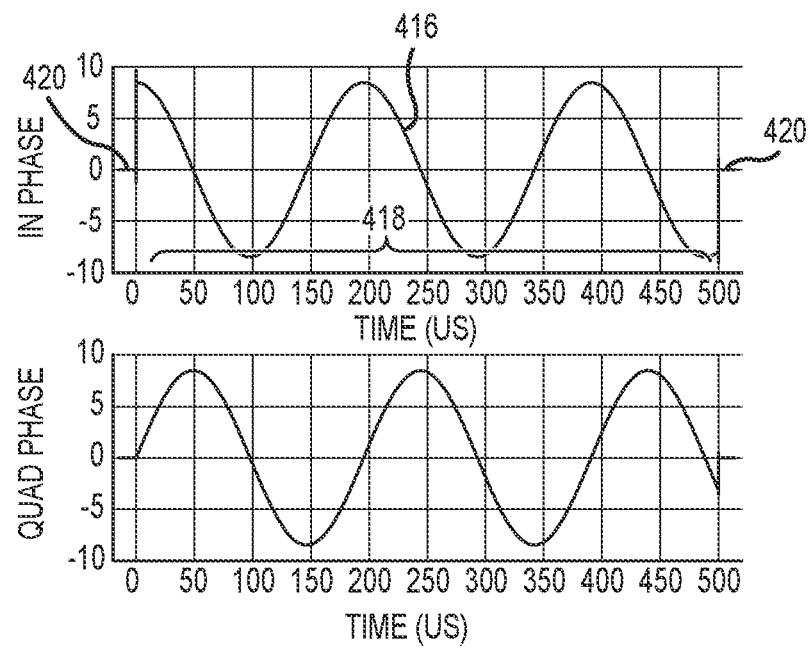
Figure 9D:
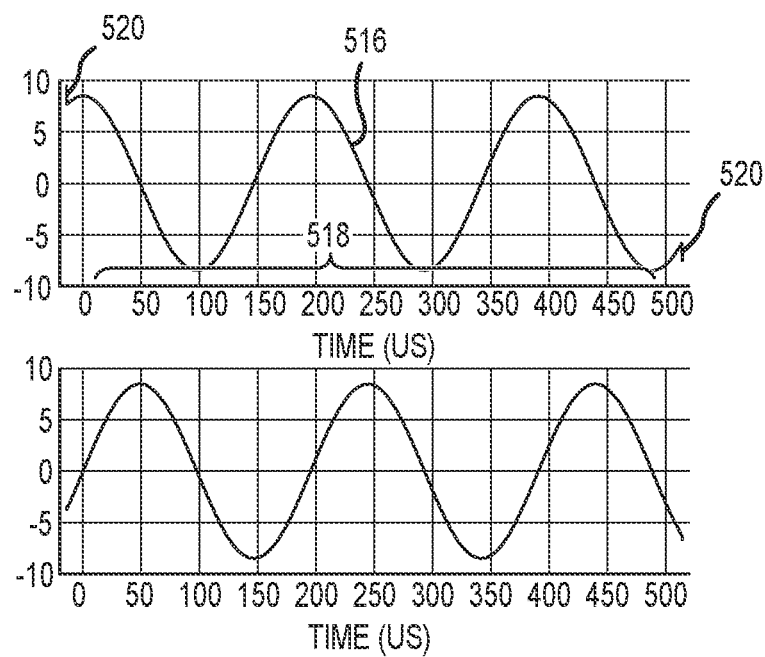
Figure 8E:
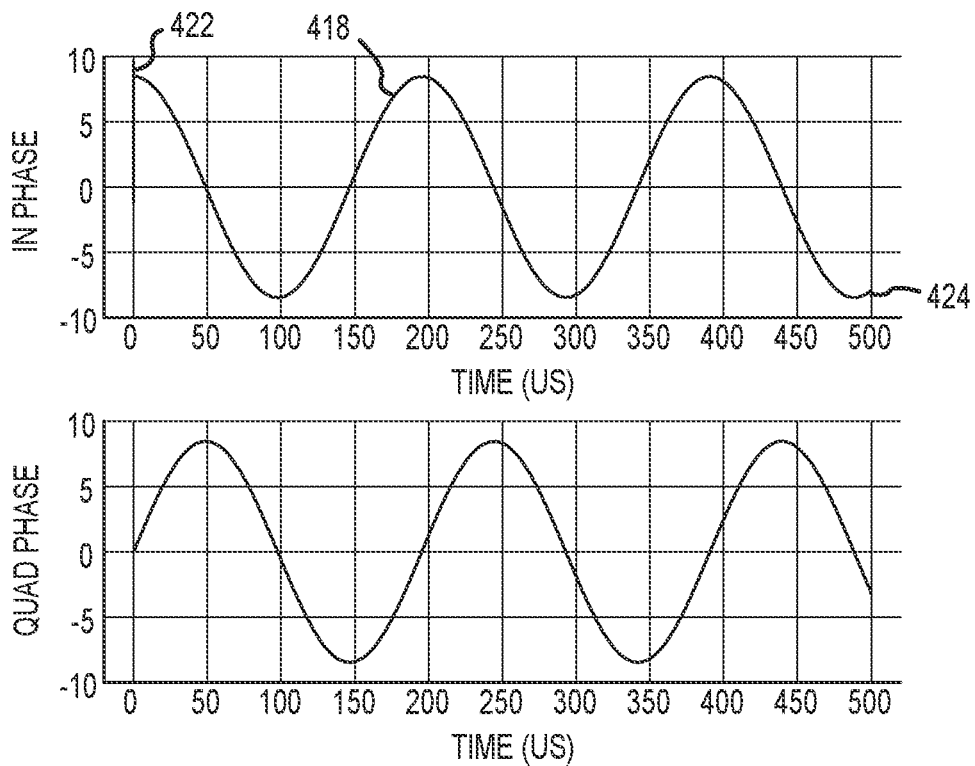
Figure 9E:
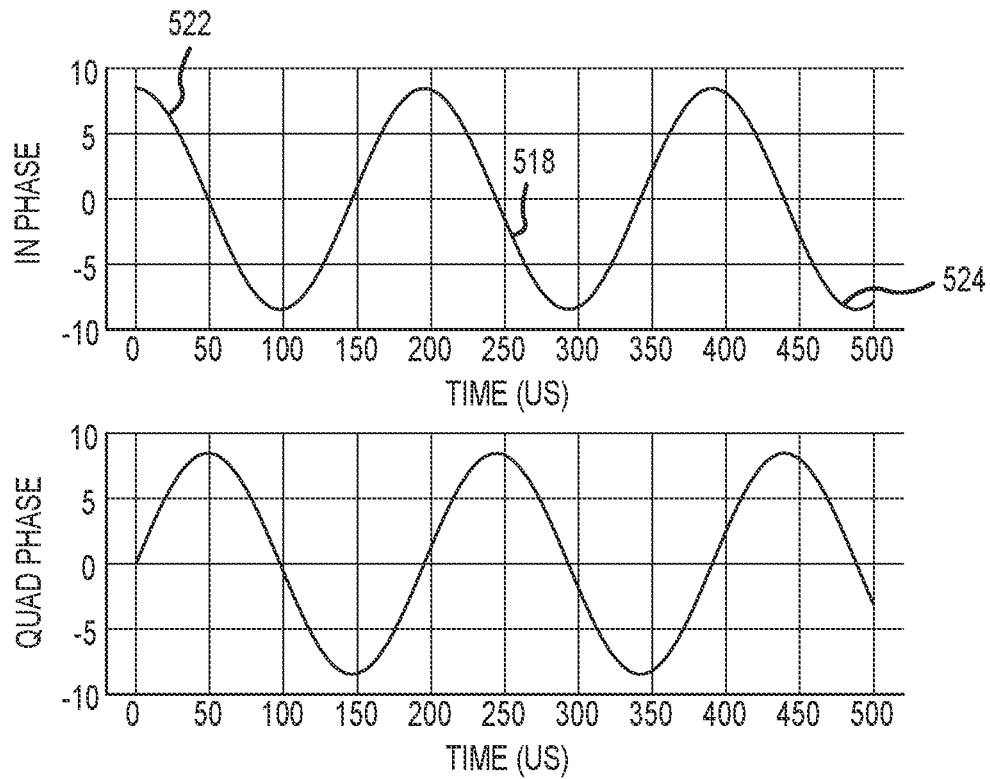
Figure 8F:
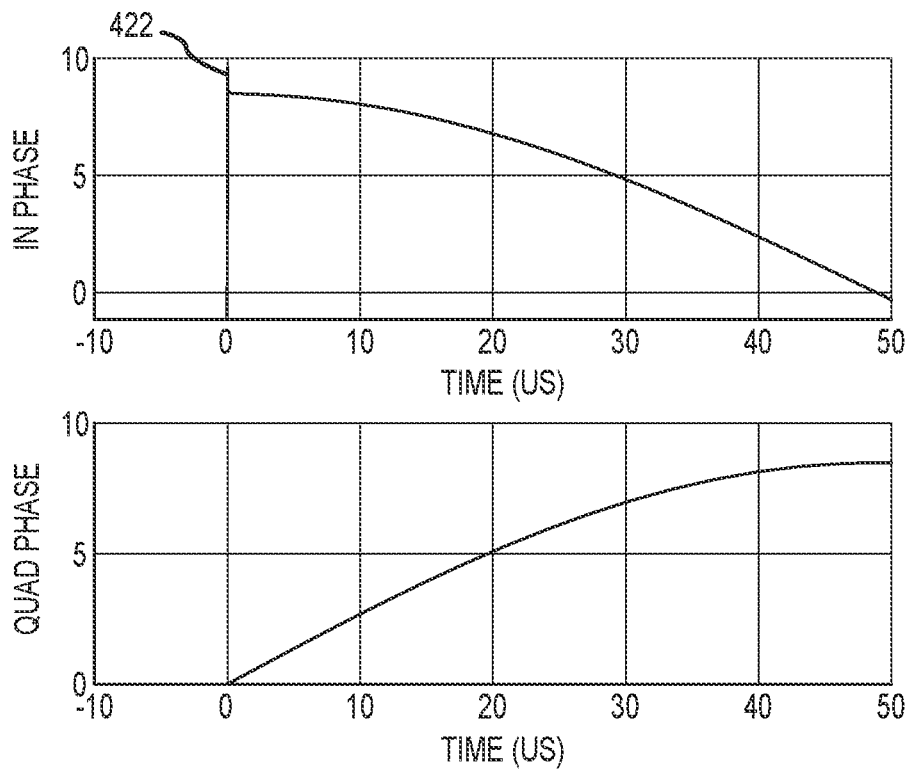
Figure 9F:
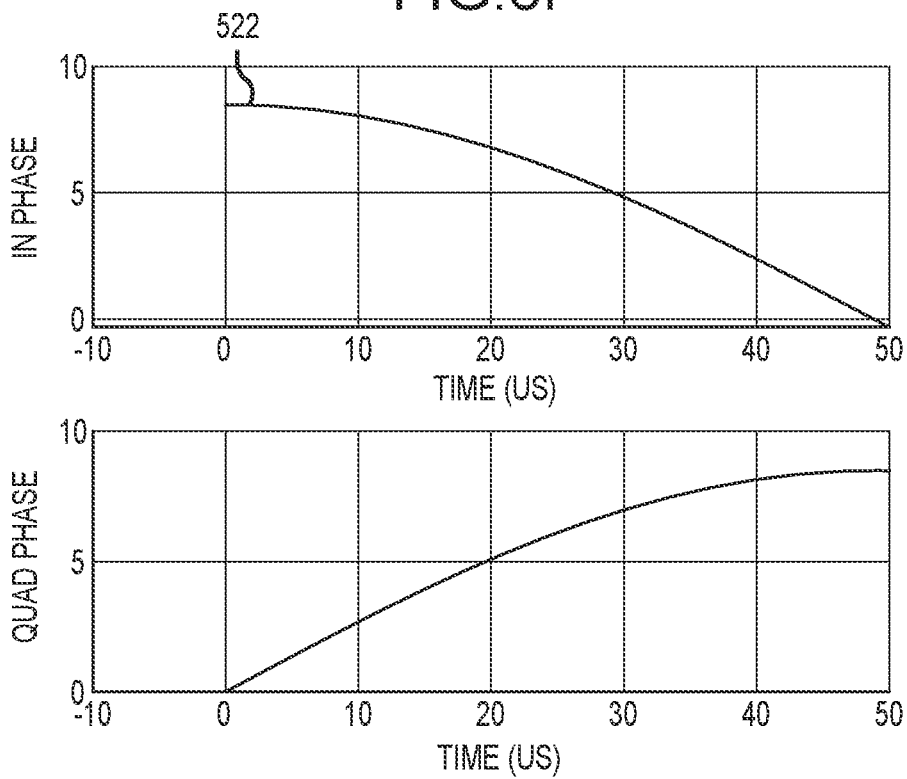
Figure 8G:
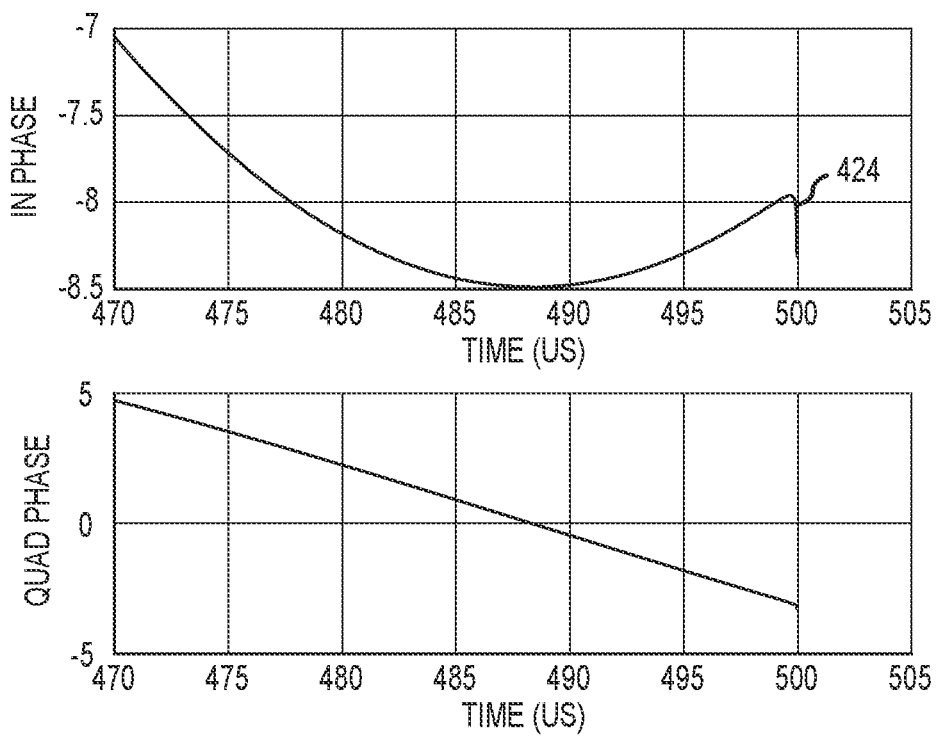
Figure 9G:
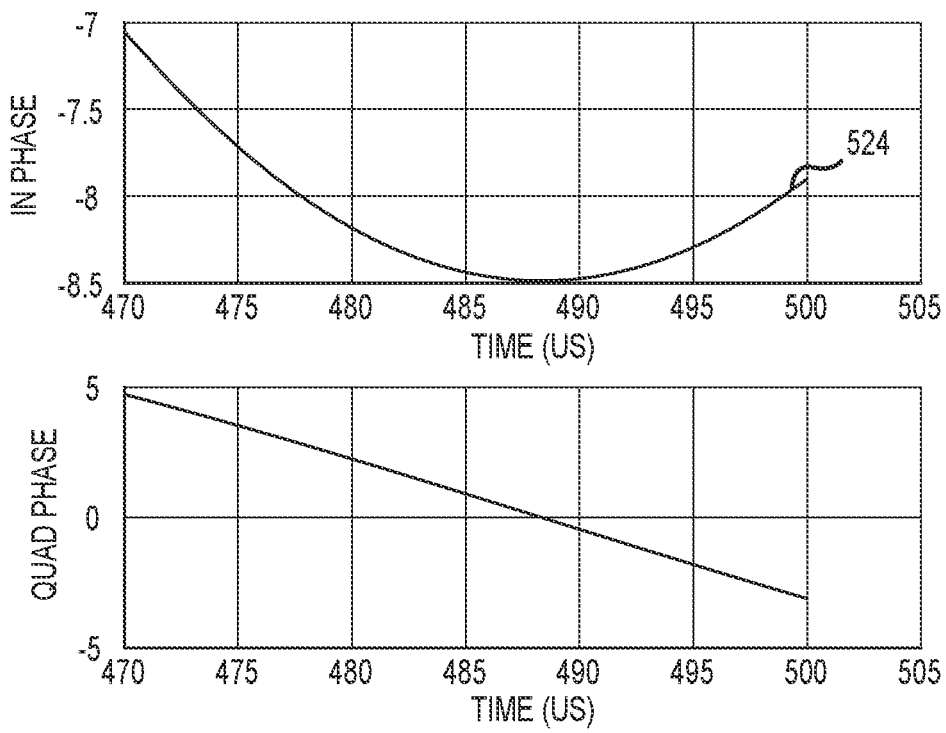

As shown in FIGS. 6a-6b, efficiency is further enhanced by using a combination of single-precision and double-precision floating-point units 240 and 242, respectively, to generate the samples of the transmitter signals with single-precision floating-point. In this example, the double-precision floating point unit 240 is part of a CPU 244 and the single-precision floating point units 240 are part of a GPU 246. All subsequent calculations are then computed in single-precision floating point. The use of double-precision floating point to calculate a reference phase for generating the samples of the transmitter signals establishes an initial higher level of accuracy. The resulting antenna signals are more accurate than they would otherwise be using single-precision throughout. Computations are saved both in the initial generation of the transmitter signals and in the subsequent processing of single-precision floating point numbers.

For each sample number n and a reference sample number r, the single-precision floating point unit 240 computes a phase $$\theta = 2*\pi*f_c\left(\frac{r}{fs}\right) + \theta ref$$

(step 250) based on the reference sample number and a reference phase where $f_c$ is the signal frequency and $f_s$ is the sampling frequency and then computes the sinusoidal signal 251 S=A*cos($\theta$) or S=A*(cos($\theta$)+sin($\theta$)) (step 252) based on that phase. An arithmetic logic unit (ALU) of the CPU increments the sample number and the reference sample number (step 254) and if the reference sample number does not exceed a threshold (step 256) and returns control to the single-precision floating point unit 240 to compute a next phase (step 250). If the threshold is exceeded, the double-precision floating point unit 242 updates the reference phase $$\theta ref = \mod\left(2*\pi*f_c\left(\frac{n}{fs}\right), 2*pi\right)$$

(step 258) for the incremented sample number, the ALU resets the reference sample number r=0 and returns control to the single-precision floating point unit 240 to compute the phase for the next sample number. The threshold is determined by the signal frequency $f_c$, which is a measure of how fast the phase is increasing. The idea is to keep the phase value bounded.

This mixed-precision technique is valid for any signal that repeats in $2\pi$, which includes any sinusoidal signal. Therefore, any transmitter signal that repeats in $2\pi$ may be represented as one or more sinusoidal signals to represent, for example, continuous wave, amplitude modulated, frequency modulated, broadband noise, or Doppler shifted signals. Any signal of interest may be represented using the mixed-precision technique.

For any floating point representation of a number, the smallest difference between any two numbers is known as the machine epsilon. The machine epsilon is dependent on the base of the number system, the magnitude of the value, and the size of the significand. The machine epsilon of a base-2 floating point number ($\varepsilon_2$) of value n with significand size p is:

$$\varepsilon_2 = \frac{2^{\lfloor \log_2 n \rfloor}}{2^{p-1}}$$

The smallest possible range the phase can always be maintained is [0, $2\pi$). As machine epsilon of base-2 floating point numbers is dependent on integer powers of 2, the range can be expanded to [0,8) without an increase in machine epsilon, which will then be bounded by $\varepsilon_2 \leq 2^{3-p}$.

$$\varepsilon_2 \leq \frac{2^{\lfloor \log_2 8 - e^2 \rfloor}}{2^{p-1}}$$

$$\varepsilon_2 \leq \frac{2^2}{2^{p-1}}$$

$$\varepsilon_2 \leq 2^{3-p}$$

Alternatively, for a desired machine epsilon $\epsilon_{max}^2$ with precision p, the upper limit for phase value is:

$$\theta_{max} = 2^{\lceil \log_2(2^{p-1}\epsilon_{max}^2)\rceil}$$

Referring now to FIGS. 7a-7f, 8a-8g and 9a-9g, as previously mentioned the update rate fur of the trajectory data establishes an update window 300 as shown in FIG. 7a. The antenna signals (GNSS and threat signals) are generated in the update window 300 at a sampling rate fs that determines a number O (fs/fur) of samples 302 that are delivered for each signal and continue to be generated at the update rate as shown in FIG. 7b. For efficiency, the length N of the FFT is a power of 2 (e.g., 2048, 4096, etc.)

As is commonly done for signal analysis, the O samples of a signal may be "zero padded" up to the length N of the FFT. Conventional zero padding of the simulated transmit signals is problematic. The application of the antenna patterns to the frequency domain signals causes a ringing effect at the window edges in the resulting time domain signal. As shown in FIGS. 8a-8g, a transmit signal 400 with in phase and quad phase components 402 and 404 is generated as a single sinusoid over an update window 406 from 0 to 500 us. The transmit signal 400 is padded with zeros 408 both before and after update window 406. This zero padding creates significant high frequency harmonic content 410 in the frequency domain transmit signal 412 produced by the N-point FFT, which remains in the frequency domain transmit signal with the antenna patterns applied 414. The IFFT produces an N-point time domain antenna signal 416 including the O samples 418 of the antenna signal in the update window and the zero padded samples 420. The zero padded samples 420 are stripped leaving only the O samples 418 to be delivered to the GNSS receiver. However, the samples 422 at the beginning of the update window and the samples 424 at the end of the update exhibit a significant amount of overshoot and ringing that distort the antenna signal 416. Given the level of accuracy required by the GNSS simulation, this distortion will, or certainly has the potential, to adversely effect the simulation results.

Referring now to FIGS. 7c-7f, to preserve the integrity of the antenna signals and remove any ringing inherent in frequency domain processing, in a preferred embodiment additional samples 304 are calculated over an extended period 306 both before and after the update window. The number of additional samples is determined by the length N 308 of the FFT. As shown in FIG. 7e, the ringing inherent to the forward and inverse frequency transformations that produces distortion 310 in the reconstructed time domain antenna signal 312 is both reduced and pushed outside update window 302. The integrity of the samples of the antenna signal 312 that are delivered to the GNSS receivers is preserved and the effects of the ringing are eliminated. Trade studies based on the update rate fur and sampling rate fus determine the minimum number 314 of additional samples that must be added both prior to and after the update window to eliminate ringing. The number of additional samples is suitably but not necessarily symmetric about the update window. Depending upon the minimum number of additional samples required, the length N of the FFT may need to be increased to the next power of two. For example, if the number of delivered samples O is 2,000 and the minimum additional samples is 150 (75 per side), the length N of the FFT would be increased from 2,048 to 4,097 to accommodate the signal extension.

The preferred "signal extension" of the O samples of a signal up to the length N of the FFT eliminates the ringing inherent in the FFT and IFFT and preserves the integrity of the antenna signals within the update window. As shown in FIGS. 9a-9g, a transmit signal 500 with in phase and quad phase components 502 and 504 is generated as a single sinusoid over an update window 506 from 0 to 500 us. The transmit signal 500 is extended with signal samples 508 both before and after update window 506. Signal extension eliminates the high frequency content 510 in the frequency domain transmit signal 512 and the signal 514 with the applied antenna effects caused by the sharp transition from signal to zeros in the zero padded approach. The difference in high frequency content between traditional "zero padding" and the current "signal extension" is striking. The IFFT produces an N-point time domain antenna signal 516 including the O samples 518 of the antenna signal in the update window and the extended signal samples 520. The extended signal samples 520 are stripped leaving only the O samples 518 to be delivered to the GNSS receiver. Noticeably, due to the lack of high frequency harmonics in the frequency domain the samples 522 caused by the sharp transition at the window edges the samples at the beginning of the update window and the samples 524 at the end of the update window exhibit no overshoot or ringing that would distort the antenna signal 516. Given the level of accuracy required by the GNSS simulation, the preservation of the integrity of the antenna signals is critical.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A Global Navigation Satellite System (GNSS) hostile environment simulator for a unit under test (UUT) having an RF receiver, comprising:
one or more processors configured to receive simulated trajectory data for the UUT and calculate geometry between the UUT and each of a plurality of simulated signal transmitters and configured to (a) based on the geometry, calculate a time-domain digital transmitter signal for each said simulated signal transmitter, (b) perform a frequency transformation on each transmitter signal, (c) apply a frequency-dependent antenna pattern for each of a plurality of RF antennas to each of the plurality of transmitter signals in the frequency domain by multiplying each transmitter signal at each frequency by a complex value representing the antenna pattern at the corresponding frequency for each RF antenna, (d) for each said RF antenna, accumulate the frequency components for all of the signal transmitters to form frequency-domain digital antenna signals, and (e) perform an inverse frequency transformation on each said antenna signal to generate time-domain digital antenna signals for each said RF antenna at baseband frequencies; and
a software defined radio (SDR) that converts the time-domain digital antenna signals from baseband to RF signals to drive the UUT's RF receiver.

2. A Global Navigation Satellite System (GNSS) hostile environment simulator, for a unit under test (UUT) having an RF receiver, comprising:
one or more processors configured to receive simulated trajectory data for the UUT and calculate geometry between the UUT and each of a plurality of simulated signal transmitters and configured to (a) based on the geometry, calculate a time-domain digital transmitter signal for each said simulated signal transmitter, (b) perform a frequency transformation on each transmitter signal, (c) apply a frequency-dependent antenna pattern for each of a plurality of RF antennas to each of the plurality of transmitter signals in the frequency domain by multiplying each transmitter signal at each frequency by a complex value representing the antenna pattern at the corresponding frequency for each RF antenna, (d) for each said RF antenna, accumulate the frequency components for all of the signal transmitters to form frequency-domain digital antenna signals, and (e) perform an inverse frequency transformation on each said antenna signal to generate time-domain digital antenna signals for each said RF antenna at baseband frequencies; and
a software defined radio (SDR) that converts the time-domain digital antenna signals from baseband to RF signals to drive the UUT's RF receiver,
wherein the one or more processors are configured to output the time-domain digital antenna signals over an update window, wherein the one or more processors are further configured in step (a) to calculate the time-domain digital transmitter signals over an extended period both before and after the update window and after performing the inverse transformation in step (e)

to retain only the portion of the time-domain digital antenna signals within the update window to eliminate ringing in the retained antenna signals.

3. The GNSS hostile environment simulator of claim 2, wherein the frequency domain transform has a length equal to a power of two, wherein a minimum extension period is specified to eliminate ringing, wherein the one or more processors are configured in step (a) to calculate a number of samples for the time domain digital transmitter signals equal to the next power of two beyond the minimum extension period and in step (b) perform the frequency domain transform with a length equal to the next power of two.

4. The GNSS hostile environment simulator of claim 1, wherein the one or more processors are configured to perform an FFT in step b and an inverse FFT in step e.

5. A Global Navigation Satellite System (GNSS) hostile environment simulator for a unit under test (UUT) having an RF receiver, comprising:
one or more processors configured to receive simulated trajectory data for the UUT and calculate geometry between the UUT and each of a plurality of simulated signal transmitters and configured to (a) based on the geometry, calculate a time-domain digital transmitter signal for each said simulated signal transmitter, (b) perform an FFT frequency transformation on each transmitter signal, (c) apply a frequency-dependent antenna pattern for each of a plurality of RF antennas to each of the plurality of transmitter signals in the frequency domain by multiplying each transmitter signal at each frequency by a complex value representing the antenna pattern at the corresponding frequency for each RF antenna, (d) for each said RF antenna, accumulate the frequency components for all of the signal transmitters to form frequency-domain digital antenna signals, and (e) perform an inverse FFT frequency transformation on each said antenna signal to generate time-domain digital antenna signals for each said RF antenna at baseband frequencies; and
a software defined radio (SDR) that converts the time-domain digital antenna signals from baseband to RF signals to drive the UUT's RF receiver,
wherein an update rate of the simulated trajectory data defines an update window and a sampling rate defines a number of samples over the update window, a minimum extension period is established to eliminate ringing in the samples of the antenna signals over the update window, wherein the one or more processors are configured in step (a) to calculate a number of samples for the time domain digital transmitter signals equal to the next power of two beyond the minimum extension period and in step b to perform the FFT with a length equal to the next power of two.

6. The GNSS hostile environment simulator of claim 1, wherein the one or more processors are configured to generate transmitter signals and apply the frequency-dependent antenna patterns over the band.

7. The GNSS hostile environment simulator of claim 1, wherein the one or more processors comprise a plurality of central processing unit (CPU) cores and a graphics processing unit (GPU).

8. The GNSS hostile environment simulator of claim 7, wherein the CPU cores are configured to compute the geometry and the GPU is configured to compute the transmitter signals, perform the frequency transformation, apply the antenna patterns and perform the inverse frequency transformation.

9. A Global Navigation Satellite System (GNSS) hostile environment simulator for a unit under test (UUT) having an RF receiver, comprising:
one or more processors configured to receive simulated trajectory data for the UUT and calculate geometry between the UUT and each of a plurality of simulated signal transmitters and configured to (a) based on the geometry, calculate a time-domain digital transmitter signal for each said simulated signal transmitter, (b) perform a frequency transformation on each transmitter signal, (c) apply a frequency-dependent antenna pattern for each of a plurality of RF antennas to each of the plurality of transmitter signals in the frequency domain by multiplying each transmitter signal at each frequency by a complex value representing the antenna pattern at the corresponding frequency for each RF antenna, (d) for each said RF antenna, accumulate the frequency components for all of the signal transmitters to form frequency-domain digital antenna signals, and (e) perform an inverse frequency transformation on each said antenna signal to generate time-domain digital antenna signals for each said RF antenna at baseband frequencies; and
a software defined radio (SDR) that converts the time-domain digital antenna signals from baseband to RF signals to drive the UUT's RF receiver,
wherein the one or more processors comprise double-precision floating point units configured to compute samples of a sinusoidal time-domain digital transmitter signal, wherein for each sample number the double-precision floating point unit computes a phase based on that sample number and then computes a sinusoid based on that phase, wherein the one or more processors are configured to perform all subsequent computations in steps (b)-(e) are performed in double-precision floating point.

10. A Global Navigation Satellite System (GNSS) hostile environment simulator for a unit under test (UUT) having an RF receiver, comprising:
one or more processors configured to receive simulated trajectory data for the UUT and calculate geometry between the UUT and each of a plurality of simulated signal transmitters and configured to (a) based on the geometry, calculate a time-domain digital transmitter signal for each said simulated signal transmitter, (b) perform a frequency transformation on each transmitter signal, (c) apply a frequency-dependent antenna pattern for each of a plurality of RF antennas to each of the plurality of transmitter signals in the frequency domain by multiplying each transmitter signal at each frequency by a complex value representing the antenna pattern at the corresponding frequency for each RF antenna, (d) for each said RF antenna, accumulate the frequency components for all of the signal transmitters to form frequency-domain digital antenna signals, and (e) perform an inverse frequency transformation on each said antenna signal to generate time-domain digital antenna signals for each said RF antenna at baseband frequencies; and
a software defined radio (SDR) that converts the time-domain digital antenna signals from baseband to RF signals to drive the UUT's RF receiver,
wherein the one or more processors comprise single-precision and double-precision floating point units configured to calculate the time-domain transmitter signal with single precision, wherein the one or more processors are configured to perform all subsequent computations in steps (b)-(e) are performed in single-precision floating point.

11. The GNSS hostile environment simulator of claim 10, wherein the one or more processors comprise single-precision and double-precision floating point units configured to calculate the transmitter signals as one or more sinusoidal signals, wherein for each sample number and a reference sample number the single-precision floating point unit computes a phase based on the reference sample number and a reference phase and then computes the sinusoidal signal based on that phase, increments the sample number and the reference sample number and if the reference sample number does not exceed a threshold computes a next phase, if the threshold is exceeded, the double-precision floating point unit updates the reference phase for the incremented sample number, resets the reference sample number and returns control to the single-precision floating point unit to compute the phase for the next sample number.

12. A Global Navigation Satellite System (GNSS) hostile environment simulator for a unit under test (UUT) having an RF receiver, comprising:

one or more processors configured to receive simulated trajectory data for the UUT and calculate geometry between the UUT and each of a plurality of simulated signal transmitters and configured to (a) based on the geometry, calculate a time-domain digital transmitter signal for each said simulated signal transmitter, (b) perform a frequency transformation on each transmitter signal, (c) apply a frequency-dependent antenna pattern for each of a plurality of RF antennas to each of the plurality of transmitter signals in the frequency domain by multiplying each transmitter signal at each frequency by a complex value representing the antenna pattern at the corresponding frequency for each RF antenna, (d) for each said RF antenna, accumulate the frequency components for all of the signal transmitters to form frequency-domain digital antenna signals, and (e) perform an inverse frequency transformation on each said antenna signal to generate time-domain digital antenna signals for each said RF antenna at baseband frequencies; and a software defined radio (SDR) that converts the time-domain digital antenna signals from baseband to RF signals to drive the UUT's RF receiver, wherein the one or more processors comprise single-precision and double-precision floating point units configured to calculate the time-domain transmitter signals as one or more sinusoidal signals, wherein for each sample number and a reference sample number the single-precision floating point unit computes a phase based on the reference sample number and a reference phase and then computes the sinusoidal signal based on that phase, increments the sample number and the reference sample number and if the reference sample number does not exceed a threshold computes a next phase, if the threshold is exceeded, the double-precision floating point unit updates the reference phase for the incremented sample number, resets the reference sample number and returns control to the single-precision floating point unit to compute the phase for the next sample number.

* * * * *

UNITED STATES PATENT AND TRADEMARK OFFICE
CERTIFICATE OF CORRECTION

PATENT NO. : 11,402,512 B2
APPLICATION NO. : 16/418498
DATED : August 2, 2022
INVENTOR(S) : Filarsky et al.

Page 1 of 1

It is certified that error appears in the above-identified patent and that said Letters Patent is hereby corrected as shown below:

On the Title Page

In Column 1, Item (54) under "Title", Line 1, delete "(54)" and insert --(54)-- therefor In the Specification In Column 8, Line 5, delete "$f_e$," and insert --$f_c$,-- therefor Signed and Sealed this
Sixth Day of June, 2023

Katherine Kelly Vidal
*Director of the United States Patent and Trademark Office*